United States Patent
Heim et al.

[11] Patent Number: 5,451,889
[45] Date of Patent: Sep. 19, 1995

[54] CMOS OUTPUT DRIVER WHICH CAN TOLERATE AN OUTPUT VOLTAGE GREATER THAN THE SUPPLY VOLTAGE WITHOUT LATCHUP OR INCREASED LEAKAGE CURRENT

[75] Inventors: Barry B. Heim, Mesa; Paul T. Hu, Tempe; Deborah Beckwith, Chandler; Freeman D. Colbert, Gilbert; MonaLisa Morgan, Mesa, all of Ariz.

[73] Assignee: Motorola, Inc., Schaumburg, Ill.

[21] Appl. No.: 209,891

[22] Filed: Mar. 14, 1994

[51] Int. Cl.⁶ .................... H03K 19/0175
[52] U.S. Cl. .................... 326/81; 327/534
[58] Field of Search ........... 307/451, 443, 473, 475, 307/296.2; 326/122, 31, 58, 81; 327/534

[56] References Cited
U.S. PATENT DOCUMENTS

| | | | |
|---|---|---|---|
| 4,782,250 | 11/1988 | Adams et al. | 307/473 |
| 4,963,766 | 10/1990 | Lundberg | 307/451 |
| 5,015,889 | 5/1991 | Reay | 307/475 |
| 5,144,165 | 9/1992 | Dhong et al. | 307/451 |
| 5,151,619 | 9/1992 | Austin et al. | 307/473 |
| 5,160,855 | 11/1992 | Dobberpuhl | 307/270 |

Primary Examiner—David R. Hudspeth
Assistant Examiner—Stephen Calogero
Attorney, Agent, or Firm—Gary W. Hoshizaki

[57] ABSTRACT

A mixed mode buffer circuit 11 including a first input (12), a second input (13), and an output (14). A voltage exceeding a supply voltage of mixed mode buffer circuit 11 can be applied to the output (14) without latchup or an increase in leakage current. The mixed mode buffer includes an output transistor (24) of a first conductivity type having a first electrode coupled to the output (14), a control electrode coupled to the first input (12), a second electrode coupled for receiving the supply voltage, and a bulk electrode. A first transistor (19) biases the bulk electrode when the voltage at the output is within a first predetermined range. A first bulk bias circuit (28) biases the bulk electrode when the output voltage is within a second predetermined range. A second bulk bias circuit (27) and a second transistor (18) couples the voltage at the output to the bulk electrode and the control electrode respectively, when the output voltage exceeds the second predetermined range.

21 Claims, 1 Drawing Sheet

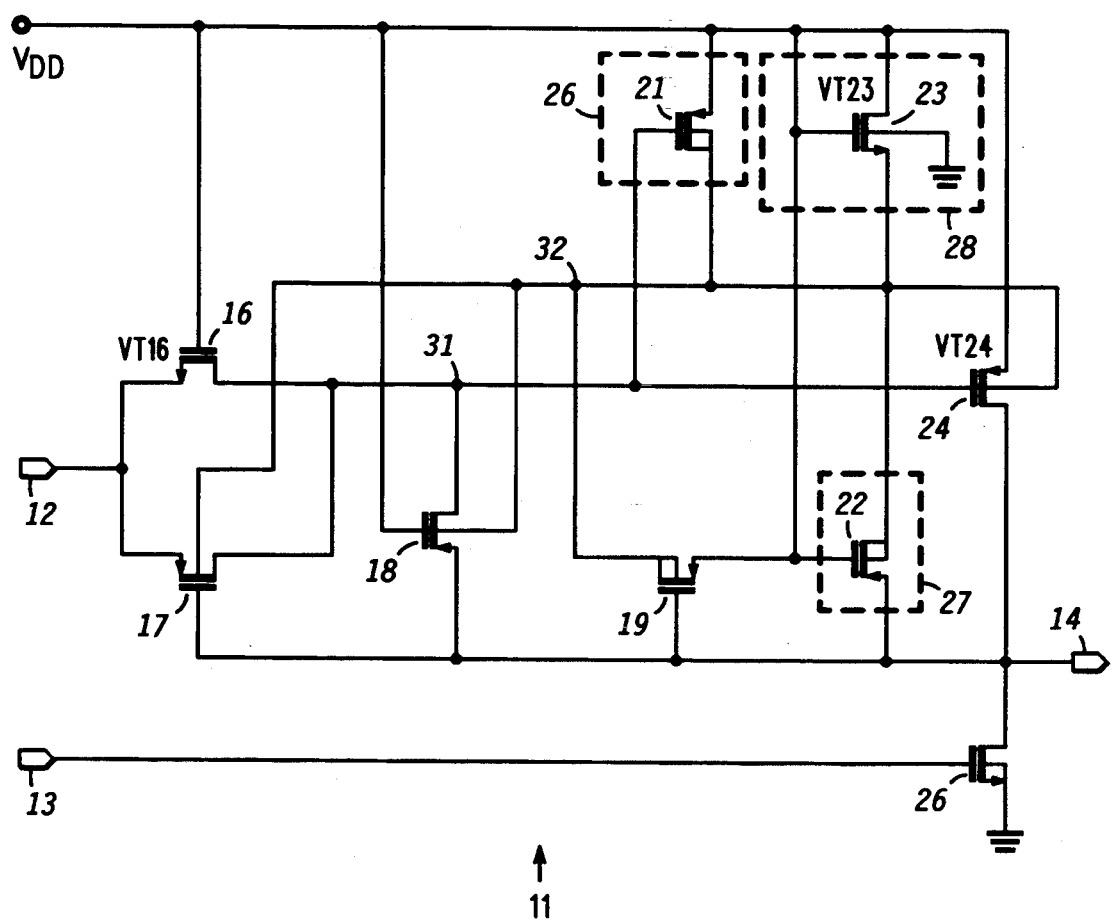

5,451,889

CMOS OUTPUT DRIVER WHICH CAN TOLERATE AN OUTPUT VOLTAGE GREATER THAN THE SUPPLY VOLTAGE WITHOUT LATCHUP OR INCREASED LEAKAGE CURRENT

BACKGROUND OF THE INVENTION

This invention relates, in general, to buffer circuits, and more particularly, to mixed power supply tri-state buffer circuits.

A bus system is well known by one skilled in the art for interconnecting multiple integrated circuits together. Tri-state buffer circuits are commonly incorporated at the outputs of each integrated circuit for reading and writing to a bus. In general, integrated circuits coupled to a bus system operate at the same voltage and provide signals having similar voltage magnitudes. For example, the standard for operating CMOS (complementary metal oxide semiconductor) digital logic circuits has been five volts. A one logic level corresponds to a signal of approximately five volts while a zero logic level corresponds to a signal having ground potential. The supply voltage for CMOS digital logic circuits is migrating from five volts to three volts due to integrated circuit processing advances. Higher density integrated circuit processes utilize smaller geometry transistors and more levels of interconnect to increase circuit density. The transistors must be biased at three volts or less due to the smaller geometry to prevent damage.

Mixed mode operation occurs when circuits operating at three volts and five volts are coupled together. A simple example is described by coupling three and five volt digital logic circuits to a common bus. Both circuit types can read and write data to the bus but the magnitudes of the logic one levels of each will differ depending on the operating voltage. A problem with mixed mode operation is that the three volt tri-state buffers may not be able to withstand a five volt signal without damaging itself or producing large leakage currents.

A standard tri-state buffer design (for non-mixed mode operation) suffers from a high current drain problem at the drain of the p-channel output device when the bus voltage exceeds its supply voltage. The bulk (n-type region) of the p-channel output device couples to the supply voltage of the tri-state buffer (for example 3 volts). The drain (p-type) of the p-channel output device couples to the bus. The PN diode formed by the bulk and drain becomes forward biased when the voltage on the bus reaches a diode drop above its supply voltage.

Buffer circuits have been designed that can interface and receive five volt signals for mixed mode applications. An example of such a circuit is described in U.S. Pat. No. 5,151,619, by John S. Austin et al. entitled "CMOS OFF CHIP DRIVER CIRCUIT" the material of which is incorporated by reference herein.

A problem may occur when buffer circuits are tri-stated and coupled to a floating bus. The voltage on a floating bus can vary from the minimum to the maximum bus voltage due to leakage currents from the integrated circuits coupled thereto. This is a problem in that a buffer circuit could latch up or have leakage currents that exceed specification at a particular voltage on the bus.

Hence, it would be of great benefit if a mixed mode buffer circuit could be provided that does not leak over any portion of the entire operating voltage range and is not prone to latch up.

BRIEF DESCRIPTION OF THE DRAWINGS

The sole FIGURE is a schematic diagram illustrating a mixed mode buffer circuit in accordance with the present invention.

DETAILED DESCRIPTION OF THE DRAWINGS

A mixed mode buffer circuit 11 is illustrated in the sole figure. Mixed mode buffer circuit 11 has an input 12, an input 13, and an output 14. Mixed mode buffer circuit 11 comprises, transistors 16–19, 24, and 26, and bulk bias circuits 26–28. In the preferred embodiment, transistors 16–19, 21–24, and 26 are MOSFETs each having a gate, drain, source, and bulk corresponding respectively to a control electrode, first electrode, second electrode, and a third electrode.

In the preferred embodiment, mixed mode buffer circuit 11 is formed in a CMOS process utilizing a p-type substrate. The p-type substrate is the bulk for n-channel MOSFETs and is typically coupled to the lowest voltage potential (e.g. ground). N-type wells are formed in the p-type substrate. P-channel MOSFETs are formed in a n-type well or in multiple wells. The n-type well (or wells) is the bulk for p-channel MOSFETs formed therein. The bulk (or n-well) is typically coupled to the highest voltage potential of the circuit (e.g. VDD). The sole figure shows the bulk couplings for transistors 16–19, 21–24, and 26 for the MOSFET process described above. The bulk of transistors 17–19, 21, 22, and 24 are common to one another. The CMOS process described above is well known in the semiconductor arts.

Transistors 24 and 26 form an output stage of mixed mode buffer circuit 11. In the preferred embodiment, transistors 24 and 26 are output transistors having large current capability for driving a large load such as a bus (not shown) at high switching speeds. Transistor 24 is a p-channel enhancement MOSFET having the gate coupled to a node 31, the drain coupled to output 14, the source coupled for receiving a first supply voltage VDD, and the bulk coupled to a node 32. Transistor 26 is a n-channel enhancement MOSFET having the gate coupled to input 13, the drain coupled to output 14, and the source coupled for receiving a second supply voltage (e.g. ground).

A signal applied to input 12 is coupled to the gate of transistor 24 through transistors 16 and 17. Transistor 16 is a n-channel enhancement MOSFET having the gate coupled for receiving the first supply voltage VDD, the drain coupled to node 31, and the source coupled to node input 12. Transistor 17 is a p-channel enhancement MOSFET having the gate coupled to output 14, the drain coupled to node 31, the source coupled to input 12, and the bulk coupled to node 32.

Mixed mode buffer circuit 11 further includes transistors 18 and 19, and bulk bias circuits 26–28. Transistor 18 is a p-channel enhancement MOSFET having a gate coupled for receiving the first supply voltage VDD, the drain coupled to node 31, the source coupled to output 14, and the bulk coupled to node 32. Transistor 19 is a p-channel enhancement MOSFET having the gate coupled to output 14, the drain coupled to node 32, the source coupled for receiving the first power supply voltage VDD, and the bulk coupled to node 32.

In the preferred embodiment, bulk bias circuit 26 comprises transistor 21, bulk bias circuit 27 comprises transistor 22, and bulk bias circuit 28 comprises transistor 23. Each bulk bias circuit 26-28 biases the bulk (node 32) for a specific voltage range.

Transistor 21 of bulk bias circuit 26 is a p-channel enhancement MOSFET having the gate coupled to node 31, the drain coupled to node 32, the source coupled for receiving the first supply voltage VDD, and the bulk coupled to node 32. Transistor 22 of bulk bias circuit 27 is a p-channel enhancement MOSFET having the gate coupled for receiving the first supply voltage VDD, the drain coupled to output 14, and the source and bulk coupled to node 32. Transistor 23 of bulk bias circuit 28 is a n-channel enhancement MOSFET having the gate and the drain coupled for receiving the first supply voltage VDD and the source coupled to node 32.

Operation of mixed mode buffer circuit 11 is described hereinafter. Mixed mode buffer circuit 11 is typically operated as a tri-state buffer. In a tri-state condition mixed mode buffer circuit 11 is in a high impedance state at output 14. Mixed mode buffer circuit 11 also writes a one or zero logic level at output 14. Table 1 describes the logic operation of mixed mode buffer circuit 11.

| Input 12 | Input 13 | Output 14 |
| --- | --- | --- |
| 0 | 0 | 1 |
| 0 | 1 | X |
| 1 | 0 | tri-state |
| 1 | 1 | 0 |

TABLE 1.

Logic operation of mixed mode buffer circuit 11.

In the first case, a zero logic level is applied to both inputs 12 and 13. The zero logic level applied to input 13 disables transistor 26. Transistor 16 is enabled and passes the zero logic level applied to input 12 to node 31, enabling transistor 24. A one logic level is generated at output 14. The one logic level at output 14 disables transistor 17. Bulk bias circuit 26 operates when input 12 is at a zero logic level. Transistor 21 of bulk bias circuit 26 is enabled by the zero logic level at node 31 and couples node 32 (the bulk) to the first supply voltage VDD.

In the second case, a zero logic level is applied to input 12 and a one logic level is applied to input 13. Applying these inputs to inputs 12 and 13 is not used because it would enable both transistors 24 and 26 simultaneously. This is a contention condition that is indicated by the symbol "X" at output 14 in table 1.

In the third case, a one logic level is applied to input 12 and a zero logic level to input 13. The one logic level applied to input 12 is coupled to node 31 disabling transistor 24. The zero logic level applied to input 13 disables transistor 26. Output 14 is at a high impedance or a tri-state condition. In the preferred embodiment, both transistors 16 and 24 have modified threshold voltages. Transistor 24 has a threshold voltage VT24 that is adjusted to be larger than a standard threshold voltage (VTP) of transistors 17-19, 21 and 22. Transistor 16 has a threshold voltage VT16 that is made smaller than a standard n-channel enhancement MOSFET threshold voltage. Transistor 16 is used as a pass transistor for coupling signals from input 12 to node 31. Transistor 16 is limited to driving node 31 to the first supply voltage VDD minus its threshold voltage VT16 when a one logic level is applied to input 12. In the preferred embodiment, the magnitude of threshold voltage VT24 is greater than the magnitude of threshold voltage VT16. This insures that transistor 24 is disabled by the one logic level provided by transistor 16 to node 31.

In the fourth and final case, a one logic level is applied to both inputs 12 and 13. The one logic level applied to input 12 is coupled to node 31 disabling transistor 24. The one logic level applied to input 13 enables transistor 26 to drive output 14 to a zero logic level. The zero logic level at output 14 enables transistor 17 to further increase the voltage at node 31 to hold transistor 24 disabled. Transistor 19 is enabled by the zero logic level at output 14 driving the bulk (node 32) to approximately the first supply voltage VDD to prevent leakage currents.

Mixed mode buffer circuit 11 is designed to co-exist with circuitry operating at higher voltages without latching up or producing large leakage currents. For example, assume mixed mode buffer circuit 11 couples to a bus and operates with the first supply voltage VDD being 3 volts. Other circuits that couple to the bus may operate at a higher supply voltage, for example 5 volts. The "mixed mode" descriptor of mixed mode buffer circuit 11 describes the fact that it can function with circuitry having logic levels of different voltage magnitudes at output 14 when in a tri-state condition.

As mentioned previously, a one logic level applied to input 12 and a zero logic level applied to input 13 disables transistors 24 and 26 thereby placing mixed mode buffer circuit 11 in a tri-state condition. Operation of mixed mode buffer circuit 11 in the tri-state condition is best described by dividing the voltage at output 14 into voltage ranges. A first voltage range for the voltage appearing at output 14 (V14) is shown by equation 1.

$$0\ volts < V14 < VDD - |VTP| \tag{1}$$

where $|VTP|$ is the threshold voltage of a standard p-channel enhancement MOSFET such as transistors 17-19, 21, and 22.

Both transistors 16 and 17 are enabled coupling the one logic level at input 12 to node 31. Node 31 is at a voltage of approximately the first supply voltage VDD under this condition. The one logic level at node 31 disables transistor 24. The common bulk of transistors 17-19, 21, 22, and 24, hereinafter called the bulk is coupled to node 32. Transistor 19 is enabled within the first voltage range charging node 32 to a voltage approximately equal to VDD thereby preventing the bulk from being forward biased.

A second voltage range for the voltage appearing at output 14 is shown by equation 2.

$$VDD - |VTP| <= V14 < VDD + |VTP| \tag{2}$$

Transistors 17, 18, 19, and 22 are disabled in the second voltage range. Transistor 16 passes the one logic level applied to input 12 to node 31. Transistor 16 is in a voltage follower configuration and cannot drive node 31 to the first supply voltage VDD. The worst case voltage appearing at node 31 (VWC31) under this condition is described by equation 3.

$$P\ VWC31 = VDD - VT16 \tag{3}$$

where VT16 is the threshold voltage of transistor 16.

As mentioned previously, the magnitude of the threshold voltage (VT16) of transistor 16 is less than the magnitude of the threshold voltage (VT24) of transistor 24. The voltage at node 31 is sufficient to disable transistor 24.

Bulk bias circuit. 28 biases the bulk when the voltage at output 14 is within the second range. Bulk bias circuit 28 comprises transistor 23 which is in a voltage follower configuration. In the preferred embodiment, transistor 23 has a threshold voltage VT23 similar to that of transistor 16. This simplifies wafer processing and allows node 32 to be charged as close to VDD as possible. The bulk voltage (Vbulk) which is the voltage appearing at node 32, is charged by transistor 23 and is described by equation 4.

$$Vbulk = VDD - VT23 \quad (4)$$

The bulk to source (or drain) junctions of transistors 17–19, 21, 22, and 24 are slightly forward biased due to the source (or drain) being coupled to a voltage at or near VDD. The magnitude of the threshold voltage (VT23) of transistor 23 is chosen to minimize leakage currents produced when the bulk junctions are forward biased. This is achieved by lowering the threshold voltage of transistor 23 until the forward bias on the bulk to source (or drain) junctions is insufficient to generate an appreciable current.

A third and final voltage range for the voltage appearing at output 14 is shown by equation 5.

$$V14 > = VDD + |VTP| \quad (5)$$

Transistors 17, 19, 21, and 23 are disabled during the third voltage range. Transistor 18 prevents transistor 24 from being enabled when the voltage at output 14 is greater than VDD+|VTP|. Transistor 24 would be enabled (without transistor 18) when the voltage from node 31 (gate) to output 14 (drain) exceeds its threshold voltage VT24. The voltage at node 31 is described by equation 3 when the voltage at output 14 is equal to VDD. Equation 6 represents the voltage appearing at output 14 to enable transistor 24.

$$\text{output } 14 = (VDD - VT16) + |VT24| \quad (6)$$

Transistor 24 remains off by enabling transistor 18 before the voltage at output 14 reaches the voltage shown in equation 6. Transistor 18 charges node 31 to a voltage approximately equal to the voltage at output 14. Transistor 24 remains disabled since the voltages at output 14 and node 31 are approximately equal. Thus, the voltage from the gate of transistor 24 to output 14 does not exceed the adjusted threshold voltage VT24. This state is maintained as the voltage applied to output 14 is increased above the voltage shown in equation 6. In the preferred embodiment, the magnitude of standard threshold voltage VTP (transistors 17–19, 21, and 22) is less than |VT24|−VT16 to insure transistor 18 is enabled before transistor 24. Transistor 16 is disabled by the voltage at node 31 protecting circuitry coupled to input 12 from a voltage greater than VDD.

Bulk bias circuit 27 biases the bulk within the third voltage range. Transistor 22 of bulk bias circuit 27 is enabled simultaneously with transistor 18 and charges the bulk to a voltage approximately equal to the voltage at output 14. The bulk voltage (node 32) is greater than or equal to all drain and source voltages of transistors 17–19, 21, and 22. Biasing the bulk with the voltage at output 14 prevents a bulk junction from being forward biased and generating high leakage currents.

By now it should be appreciated that a mixed mode buffer circuit has been provided. Mixed mode buffer circuit 11 when in a tri-state condition is capable of withstanding a voltage at output 14 greater than its supply voltage. A first transistor biases the bulk electrode when the voltage at the output is within a first predetermined range. A first bulk bias circuit biases the bulk electrode when the output voltage is within a second predetermined range. A second bulk bias circuit and a second transistor couples the voltage at the output to the bulk electrode and the control electrode respectively, when the output voltage exceeds the second predetermined range.

While specific embodiments of the present invention have been shown and described, further modifications and improvements will occur to those skilled in the art. It is understood that the invention is not limited to the particular forms shown and it is intended for the appended claims to cover all modifications which do not depart from the spirit and scope of this invention.

We claim:

1. A mixed mode buffer circuit including a first input, a second input, and an output, comprising:

a first transistor of a first conductivity type having a first electrode, a control electrode coupled for receiving a first supply voltage, and a second electrode coupled to the first input;

a first output transistor of a second conductivity type having a first electrode coupled to the output, a control electrode coupled to said first electrode of said first transistor, a second electrode coupled for receiving said first supply voltage, and a bulk electrode;

a second output transistor of said first conductivity type having a first electrode coupled to the output, a control electrode coupled to the second input, and a second electrode coupled for receiving a second supply voltage; and a second transistor of said first conductivity type having a first electrode and a control electrode coupled for receiving said first supply voltage, and a second electrode coupled to said bulk electrode of said first output transistor wherein said second transistor biases said bulk electrode of said first output transistor to a different voltage potential than said second electrode of said first output transistor.

2. The mixed mode buffer circuit as recited in claim 1 further including a third transistor of said second conductivity type having a first electrode and bulk electrode coupled to said bulk electrode of said first output transistor, a control electrode coupled to the output, and a second electrode coupled for receiving said first supply voltage.

3. The mixed mode buffer circuit as recited in claim 2 further including a fourth transistor of said second conductivity type having a first electrode coupled to said control electrode of said first output transistor, a control electrode coupled for receiving said first supply voltage, a second electrode coupled to the output, and a bulk electrode coupled to said bulk electrode of said first output transistor.

4. The mixed mode buffer circuit as recited in claim 3 further including a fifth transistor of said second conductivity type having a first electrode and a bulk electrode coupled to said bulk electrode of said first output transistor, a control electrode coupled to said control electrode of said first output transistor, and a second electrode coupled for receiving said first supply voltage.

5. The mixed mode buffer circuit as recited in claim 4 further including a sixth transistor of said second conductivity type having a first electrode and a bulk electrode coupled to said bulk electrode of said first output transistor, a control electrode coupled for receiving said first supply voltage, and a second electrode coupled to the output.

6. The mixed mode buffer circuit as recited in claim 5 further including a seventh transistor of said second conductivity type having a first electrode coupled to said control electrode of said first output transistor, a control electrode coupled to the output, a second electrode coupled to the first input, and a bulk electrode coupled to said bulk electrode of said first output transistor.

7. The mixed mode buffer circuit as recited in claim 6 wherein a threshold voltage magnitude of said first output transistor is greater than a threshold voltage magnitude of said first transistor.

8. The mixed mode buffer circuit as recited in claim 7 wherein a threshold voltage magnitude of said first output transistor is greater than threshold voltage magnitude of said second transistor.

9. The mixed mode buffer circuit as recited in claim 8 wherein a threshold voltage magnitude of said sixth transistor is less than said threshold voltage magnitude of said first output transistor minus said threshold voltage magnitude of said second transistor.

10. A mixed mode buffer circuit including a first input, a second input, and an output, comprising:
 a first transistor of a first conductivity type having a first electrode, a control electrode coupled for receiving a first supply voltage, and a second electrode coupled to the first input;
 a first output transistor of a second conductivity type having a first electrode coupled to the output, a control electrode coupled to said first electrode of said first transistor, a second electrode coupled for receiving said first supply voltage, and a bulk electrode;
 a second output transistor of said first conductivity type having a first electrode coupled to the output, a control electrode coupled to the second input and a second electrode coupled for receiving a second supply voltage;
 a second transistor of said second conductivity type having a first electrode and bulk electrode coupled to said bulk electrode of said first output transistor, a control electrode coupled to the output, and a second electrode coupled for receiving said first supply voltage, said second transistor being enabled for providing a bias voltage to said bulk of said first output transistor when a voltage at the output of the mixed mode buffer circuit is within a first voltage range, said first voltage range ranging from said second supply voltage to a first predetermined voltage; and
 a first bulk bias circuit having a terminal coupled to said bulk electrode of said first output transistor, said first bulk bias circuit being enabled for providing a bias voltage to said bulk electrode of said first output transistor when said voltage at the output of mixed mode buffer circuit is within a second voltage range, said second voltage ranging from said first predetermined voltage to a second predetermined voltage;
 a third transistor of said second conductivity type having a first electrode coupled to said control electrode of said first output transistor, a control electrode coupled for receiving said first supply voltage, a second electrode coupled to the output, and a bulk electrode coupled to said bulk electrode of said first output transistor; and
 a second bulk bias circuit having a terminal coupled to said bulk electrode of said first output transistor, said second bulk bias circuit applying a bias voltage to said bulk electrode of said first output transistor when a logic zero is applied to the first input of the mixed mode buffer circuit.

11. A mixed mode buffer circuit as recited in claim 10 wherein said first bulk bias circuit comprises a transistor of said first conductivity type having a first electrode and control electrode coupled for receiving said first supply voltage, and a second electrode coupled to said terminal of said first bulk bias circuit.

12. A mixed mode buffer circuit as recited in claim 11 wherein a threshold voltage magnitude of said first output transistor is greater than a threshold voltage magnitude of said transistor of said first bulk bias circuit.

13. A mixed mode buffer circuit as recited in claim 12 further including a third bulk bias circuit having a terminal coupled to said bulk electrode of said first output transistor, said third bulk bias circuit being enabled for providing a bias voltage to said bulk electrode of said first output transistor when said voltage at the output of the mixed mode buffer exceeds said second predetermined voltage.

14. A mixed mode buffer circuit as recited in claim 13 wherein said third bulk bias circuit comprises a transistor of said second conductivity type having a first electrode and bulk electrode coupled to said bulk electrode of said first output transistor, a control electrode coupled for receiving said first supply voltage, and a second electrode coupled to the output.

15. A mixed mode buffer circuit as recited in claim 14 wherein a threshold voltage magnitude of said transistor of said third bulk bias circuit is less than said threshold voltage magnitude of said first output transistor minus said threshold voltage magnitude of said transistor of said first bulk bias circuit.

16. A mixed mode buffer circuit as recited in claim 10 wherein a threshold voltage magnitude of said first output transistor is greater than a threshold voltage magnitude of said first transistor.

17. A mixed mode buffer circuit as recited in claim 18 further including a fourth transistor of said second conductivity type having a first electrode coupled to said control electrode of said first output transistor, a control electrode coupled to the output, a second electrode coupled to the first input, and a bulk electrode coupled to said bulk electrode of said first output transistor.

18. A buffer circuit having a first input, a second input, and an output, the buffer circuit comprising:
 a first output transistor of a first conductivity type having a first electrode coupled to the output, a control electrode, a second electrode coupled for receiving a first supply voltage, and a bulk electrode;

a second output transistor of a second conductivity type having a first electrode coupled to the output, a control electrode coupled to the second input, and a second electrode coupled for receiving a second supply voltage;

a pass transistor of said second conductivity type having a first electrode coupled to said control electrode of said first output transistor, a control electrode coupled for receiving said first supply voltage, and a second electrode coupled to the first input;

a first transistor of said second conductivity type having a first electrode and gate electrode coupled for receiving said first supply voltage, and a second electrode coupled to said bulk electrode of said first output transistor;

a second transistor of said first conductivity type having a first electrode and bulk electrode coupled to said bulk electrode of said first output transistor, a control electrode coupled for receiving said first supply voltage, and a second electrode coupled to the output;

a third transistor of said first conductivity type having a first electrode coupled to said control electrode of said first output transistor, a control electrode coupled for receiving a first supply voltage, a second electrode coupled to the output, and a bulk electrode coupled to said bulk electrode of said first output transistor;

a fourth transistor of said first conductivity type having a first electrode and bulk electrode coupled to said bulk electrode of said first output transistor, a control electrode coupled to the output, and a second electrode coupled for receiving said first supply voltage; and a fifth transistor of said first conductivity type having a first electrode and a bulk electrode coupled to said bulk electrode of said first output transistor, a control electrode coupled to said control electrode of said first output transistor, and a second electrode coupled for receiving said first supply voltage.

19. A buffer circuit as recited in claim 18 wherein a threshold voltage magnitude of said first transistor is less than a threshold voltage magnitude of said first output transistor.

20. A buffer circuit as recited in claim 19 wherein a threshold voltage magnitude of said second transistor is less than a said threshold voltage magnitude of said first output transistor minus said threshold voltage magnitude of said first transistor.

21. The buffer circuit of claim 17 further including a sixth transistor of said second conductivity type having a first electrode coupled to said control electrode of said first output transistor, a control electrode coupled to the output, a second electrode coupled to the first input, and a bulk electrode coupled to said bulk electrode of said first output transistor.

* * * * *